United States Patent [19]

Branson

[11] 4,360,746

[45] Nov. 23, 1982

[54] DIODE AND VARISTOR SIMULATOR

[75] Inventor: Carl B. Branson, Glendale Heights, Ill.

[73] Assignee: GTE Automatic Electric Labs Inc., Northlake, Ill.

[21] Appl. No.: 202,987

[22] Filed: Nov. 3, 1980

[51] Int. Cl.[3] .............................................. H03K 5/08

[52] U.S. Cl. .................................. 307/494; 307/493; 307/551

[58] Field of Search ................... 307/317 R, 490, 493, 307/494, 503, 551, 565

[56] References Cited

U.S. PATENT DOCUMENTS 3,541,350 11/1970 Lvetze ................................ 307/490
3,839,647 10/1974 Simmons ............................ 307/490
4,200,843 4/1980 Egami et al. ........................ 307/494

*Primary Examiner*—John Zazworsky
*Attorney, Agent, or Firm*—Robert J. Black; Charles A. Doktycz

[57] ABSTRACT

An active circuit for modeling desireable diode and varistor characteristics in signal limiting circuits. The circuit includes a resistor arrangement for setting the desireable threshold voltage to an operational amplifier, the other input of which is connected to a reference voltage level. The amplifier output is tied back to the circuit input and to one input of a second amplifier. A second input is connected to the reference voltage level to act as a current sensor to vary the threshold level in response to the current flow.

3 Claims, 2 Drawing Figures

DIODE AND VARISTOR SIMULATOR

BACKGROUND OF THE INVENTION (1) Field of the Invention

The present invention relates to circuits for modeling diodes and varistors required in circuits such as signal limiting circuits used in telephone transmission equipment.

(2) Description of the Prior Art

Previously, diode or varistor devices were multipled in either a series or parallel configuration so as to vary the effective forward breakdown or threshold voltage. But, no similar technique was available for materially changing the active region characteristics of these devices. Alternately, new devices would be developed for particular applications. However, this was an iterative process requiring well defined voltage-current relationships which would not always be available. In a common implementation of an "ideal diode" an operational amplifier is utilized as a threshold detector with its output tied across the circuit reference element. A technique similar to this was disclosed by Eugene R. Schlesinger in an article appearing in Electronic Design on Apr. 26, 1977. As with other techniques, this one also did not provide for control in the active region of the diode characteristic.

SUMMARY OF THE INVENTION

Accordingly, it is an object of the present invention to provide a varistor simulator circuit which can be utilized to obtain required voltage-current relationships for the development of new devices.

A varistor may be viewed as a pair of diodes connected in inverse parallel. A look at a diode voltage-current curve shows that below a specific voltage there is little or no current flow. As the voltage across the diode is increased, the current through it also increases, but in an exponential manner.

This same type of response may be obtained by properly combining an operational amplifier threshold detector and a differential amplifier. The input and reference element for the threshold detector is a resistive voltage divider, typically a potentiometer for ease of adjustment. This element in conjunction with the operational amplifier threshold detector establishes the equivalent of the diode forward voltage characteristic.

The differential amplifier has a current sensing component for its input reference connected between the output of the threshold detector and the input of the circuit. The output of the differential amplifier is connected to a second voltage divider network associated with the input reference. This "current generated" voltage varies the threshold level of the input detector. It is this latter arrangement that makes this circuit capable of simulating and varying the dynamic slope of the diode dynamic impedance curve.

BRIEF DESCRIPTION OF THE DRAWINGS

These and other objects and advantages, features and uses of the invention will become more apparent to those skilled in the art by referring to the following description and the attached drawings, in which.

DESCRIPTION OF THE PREFERRED EMBODIMENT

Figure 1:
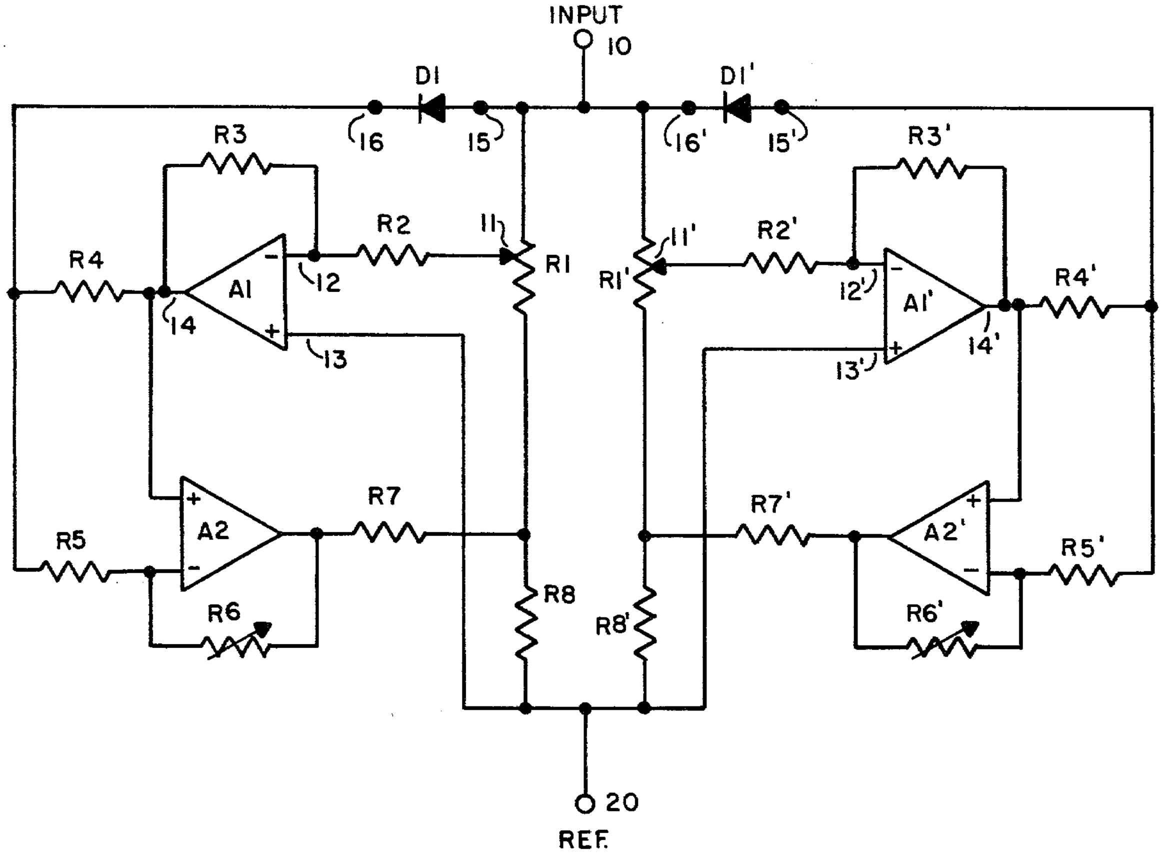
FIG. 1 is a simplified circuit schematic of the varistor simulator embodying the present invention.

In FIG. 1 of the drawing there is shown a varistor simulator circuit according to the invention. It is composed of two similar sub circuits, each of which may be viewed as a diode simulator having one end connected to an input 10 and the other end to a voltage reference terminal 20. Since the operation of the two diode simulators is the same, the description is directed to the simulator circuit having the unprimed reference characters. The description of the second circuit can be read as that of the one described by adding a prime to the characters in the description.

The input reference for the threshold detector function includes a potentiometer R1 having one end connected to the input terminal 10 and the other end via a resistor R8 to the reference terminal 20. The wiper 11 of the potentiometer R1 is connected via resistor R2 to an inverting input 12 of the operational amplifier A1. This voltage divider established by the wiper 11 and the resistance of R8 sets the threshold level, simulating the forward voltage, of the device. The operational amplifier A1 includes a second input 13 which is connected to the reference terminal 20, and an output terminal 14 connected back to the input terminal 10 via resistor R4 and the cathode 16 to anode 15 direction of diode D1. The function of the diode D1 is to limit the operation of the amplifier A1 to the positive half cycle swings of the signal. While the diode D1' of the companion circuit is limited to the negative half cycles.

A resistor R3 is placed between the output 14 and the input 12 of the amplifier A1 to set the amount of gain.

Figure 2:
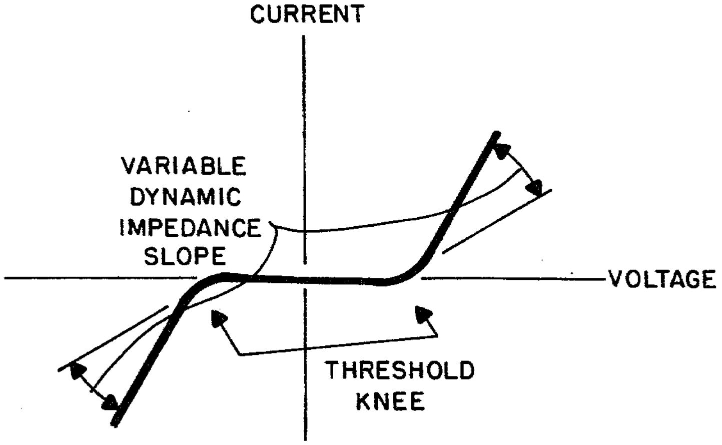
FIG. 2 is a characteristic curve useful in understanding the circuit of FIG. 1.

The differential amplifier A1 has its non-inverting input connected to the output of amplifier A1, while its inverting input is connected to terminal 16 of the diode via resistor R5. It thus senses current as the voltage difference that occurs across resistor R4. The output is connected via a resistor R7 to the junction of resistors R1 and R8, which causes the action of amplifier A2 to increment the threshold as the input voltage varies. A variable resistor R6 between the inverting input and the output terminals of amplifier A2 is included for setting the gain, which corresponds to the selection of the active region characteristic, the slope of the forward voltage curve, of the varistor as shown on FIG. 2.

It should be readily obvious that such characteristics as junction capacitance and leakage resistance can be easily simulated by adding appropriately sized resistors or capacitors between the input and reference nodes of the invention. Also, the schematic representation of the invention is shown in its fundamental form. Component changes or substitutions for any of the elements to extend the operating range or to improve performance for a particular application will in no way change the concept of the invention.

What is claimed is:

1. A two terminal varistor simulator circuit having an input and a reference terminal comprising a first and a second diode simulator circuit each further comprising:
   - a resistive voltage divider having a first end terminal connected to said input terminal and a second end terminal and an adjustable tap terminal,
   - a first and a second operational amplifier each having a first and a second input means and an output means,
   - a first resistor having a first and a second terminal, means connecting said resistive voltage divider tap terminal to said first input means of said first operational amplifier operating in an inverting mode to thereby select a voltage reference, and said second end terminal to said first resistor first terminal, said first operational amplifier second terminal and said first resistor second terminal connected to said reference terminal, a diode and a second resistor connected in series and between said input terminal and said first operational amplifier output terminal to limit said operational amplifier to half wave operation, said second operational amplifier output terminal connected to said resistive voltage divider second terminal, a variable resistor connected across said second operational amplifier first input terminal and said output terminal to adjustably set the requisite gain, said first operational amplifier output terminal further connected to said second operational amplifier second input terminal, said second operational amplifier first input terminal connected to the junction of said diode and second resistor placing said second operational amplifier inputs across said second resistor to thereby respond to the current flow of said first operational amplifier.

2. A two terminal varistor simulator circuit as claimed in claim 1, further including a third resistor connected across said first operational amplifier first input terminal and said output terminal to set said amplifier gain level.

3. A two terminal varistor simulator circuit as claimed in claim 1, wherein said first diode simulator circuit diode has the cathode end connected to its associated first operational amplifier to limit operation thereof to positive excursions of an input voltage, and said second diode simulator circuit diode has the anode end connected to its associated first operational amplifier to limit operation thereof to negative excursions of the input voltage.

* * * * *